United States Patent
Kang et al.

(10) Patent No.: US 8,178,406 B2
(45) Date of Patent: May 15, 2012

(54) SPLIT GATE DEVICE AND METHOD FOR FORMING

(75) Inventors: Sung-Taeg Kang, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 483 days.

(21) Appl. No.: 11/926,323

(22) Filed: Oct. 29, 2007

(65) Prior Publication Data
US 2009/0108325 A1   Apr. 30, 2009

(51) Int. Cl.
*H01L 27/088* (2006.01)
*H01L 27/108* (2006.01)

(52) U.S. Cl. ........ 438/259; 438/151; 438/197; 438/270; 438/589; 257/366; 257/E29.135; 257/E21.635; 257/E21.638

(58) Field of Classification Search .................. 438/157, 438/176, 195, 267, 283, 585–596, 259, 270, 438/288, 972; 257/E29.125–E29.131, E29.134–E29.138, 257/E29.14–E29.161, E29.275, E29.319, 257/E21.176–E21.186, E21.374, E21.458, 257/E21.621–E21.624, E21.635–E21.638
See application file for complete search history.

(56) References Cited

U.S. PATENT DOCUMENTS

| | | | | |
|---|---|---|---|---|
| 6,232,185 | B1 * | 5/2001 | Wang | 438/266 |
| 6,686,622 | B2 * | 2/2004 | Noro et al. | 257/314 |
| 7,700,439 | B2 * | 4/2010 | Prinz et al. | 438/267 |
| 7,704,830 | B2 * | 4/2010 | Rao et al. | 438/257 |
| 2003/0157770 | A1 | 8/2003 | Chu et al. | |
| 2004/0188753 | A1 * | 9/2004 | Kawashima et al. | 257/316 |
| 2005/0063208 | A1 * | 3/2005 | Park et al. | 365/10 |
| 2005/0164450 | A1 * | 7/2005 | Fang et al. | 438/257 |
| 2005/0259467 | A1 | 11/2005 | Forbes | |
| 2005/0259475 | A1 | 11/2005 | Forbes | |
| 2006/0270158 | A1 * | 11/2006 | Chang et al. | 438/257 |
| 2008/0090349 | A1 * | 4/2008 | Hoentschel et al. | 438/229 |
| 2008/0121974 | A1 * | 5/2008 | Steimle et al. | 257/319 |

* cited by examiner

*Primary Examiner* — Matthew Landau
*Assistant Examiner* — Maliheh Malek
(74) *Attorney, Agent, or Firm* — Joanna G. Chiu; James L. Clingan, Jr.

(57) ABSTRACT

A method of making a semiconductor device on a semiconductor layer includes forming a select gate, a recess, a charge storage layer, and a control gate. The select gate is formed have a first sidewall over the semiconductor layer. The recess is formed in the semiconductor layer adjacent to the first sidewall of the select gate. The thin layer of charge storage material is formed in which a first portion of the thin layer of charge storage material is formed in the first recess and a second portion of the thin layer of charge storage material is formed along the first sidewall of the first select gate. The control gate is formed over the first portion of the thin layer of charge storage material. The result is a semiconductor device useful a memory cell.

12 Claims, 8 Drawing Sheets

SPLIT GATE DEVICE AND METHOD FOR FORMING

BACKGROUND

1. Field

This disclosure relates generally to semiconductor processing, and more specifically, to split gate devices.

2. Related Art

Split gate devices, which include both a select gate and a control gate, are typically used as bitcell storage devices within nonvolatile memory arrays. The use of a separate select gate for the bitcells in such arrays allows for improved isolation and reduced bitcell disturb during programming and reading of the bitcells. However, due to the length of the select gates and control gates, reduced drive current is obtained which degrades reading performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, split gate devices are useful as bitcells in a memory. One embodiment described herein includes a method for forming a split gate device which may allow for improved performance. For example, in one embodiment, a split gate device includes a rounded-corner recessed region adjacent a sidewall of the select gate in which portions of the charge storage layer and the control gate are formed. Also, in one embodiment, two split gate devices having a shared source/drain region may be simultaneously formed, each having a rounded-corner recessed region in which portions of the corresponding charge storage layer and control gate are formed.

Figure 1:
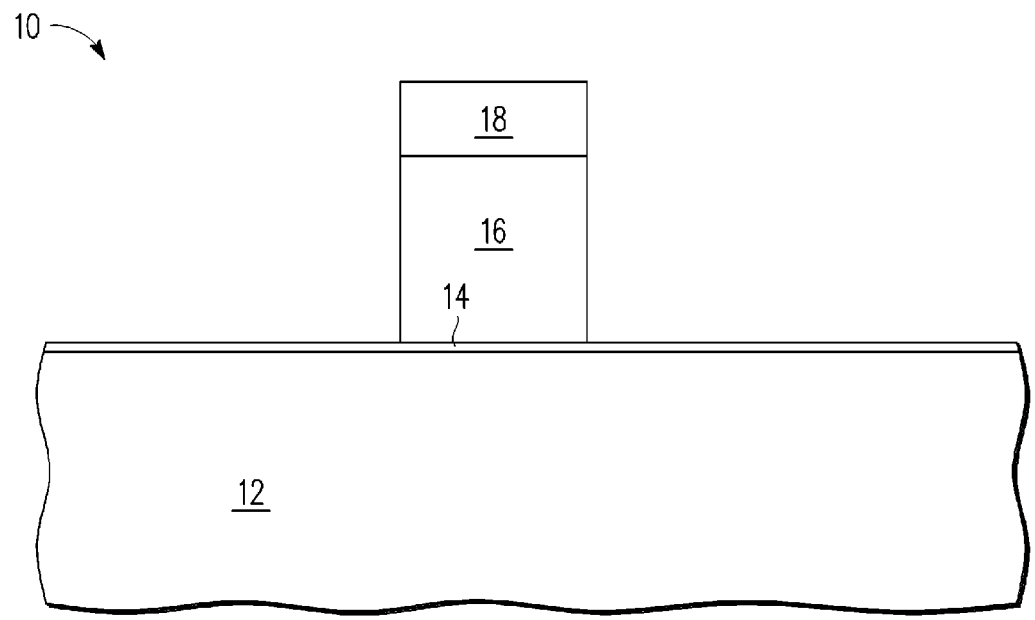
FIGS. 1-11 illustrate a method for forming a split gate semiconductor device in accordance with one embodiment of the present invention.

FIG. 1 illustrates a semiconductor structure 10 having a semiconductor substrate 12. Semiconductor substrate 12 described herein can be any semiconductor material or combinations of materials, such as gallium arsenide, silicon germanium, silicon-on-insulator (SOI), silicon, monocrystalline silicon, the like, and combinations of the above. Semiconductor substrate 12 may also be referred to as a semiconductor layer. Semiconductor structure 10 includes a gate dielectric layer 14 over substrate 12, a select gate 16 over gate dielectric layer 14, and an anti-reflective coating (ARC) 18 over select gate 16. Therefore, note that in the illustrated embodiment, gate dielectric layer 14 is formed on semiconductor layer 12 and select gate 16 is formed on gate dielectric layer 14. Gate dielectric layer 14 may be any appropriate gate dielectric layer, such as, for example, a gate oxide layer. Select gate 16 may be a polysilicon gate formed, for example, by depositing and patterning a polysilicon layer over gate dielectric layer 14. Alternatively, select gate 16 may also be metal, titanium nitride, or a combination of materials.

Figure 2:
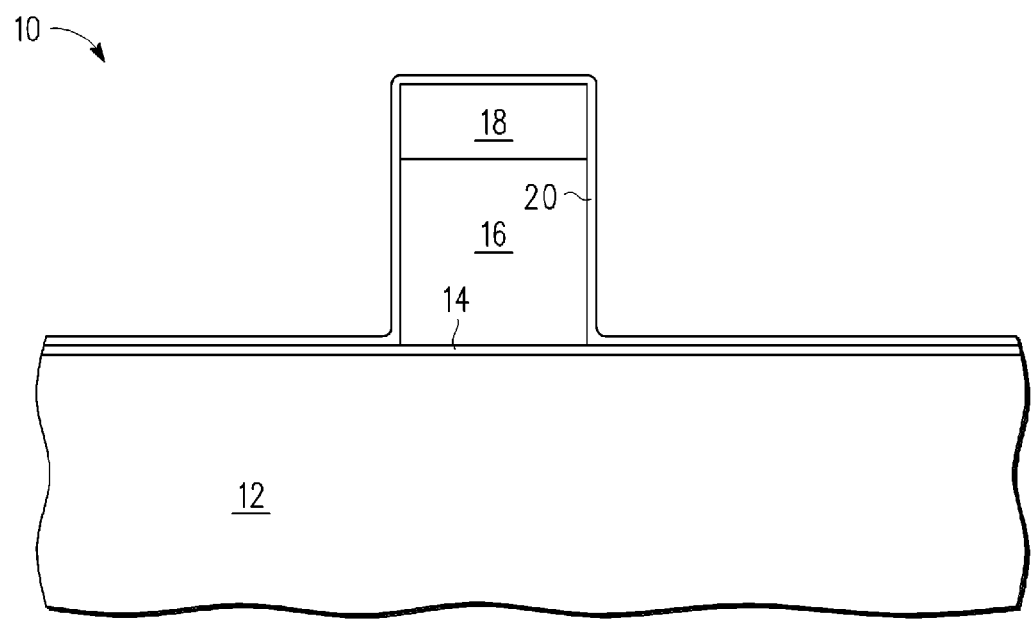

FIG. 2 illustrates semiconductor structure 10 after formation of a liner layer 20. In one embodiment, liner layer 20 may be formed by depositing an oxide. Liner layer 20 may be formed to protect the sidewalls of select gate 16 during subsequent processing.

Figure 3:
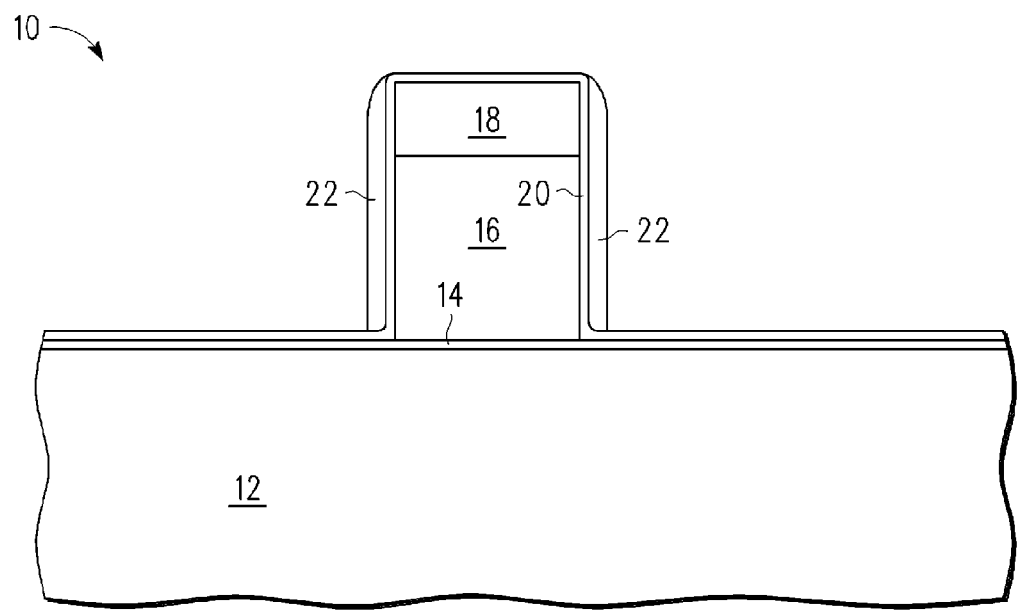

FIG. 3 illustrates semiconductor structure 10 after formation of a sidewall spacer 22 around select gate 16, adjacent sidewalls of select gate 16. In one embodiment, spacer 22 may include nitride or germanium or any other material or combination of materials that has, for example, selectivity to oxide. Conventional deposition and etching can be used to form spacer 22.

Figure 4:
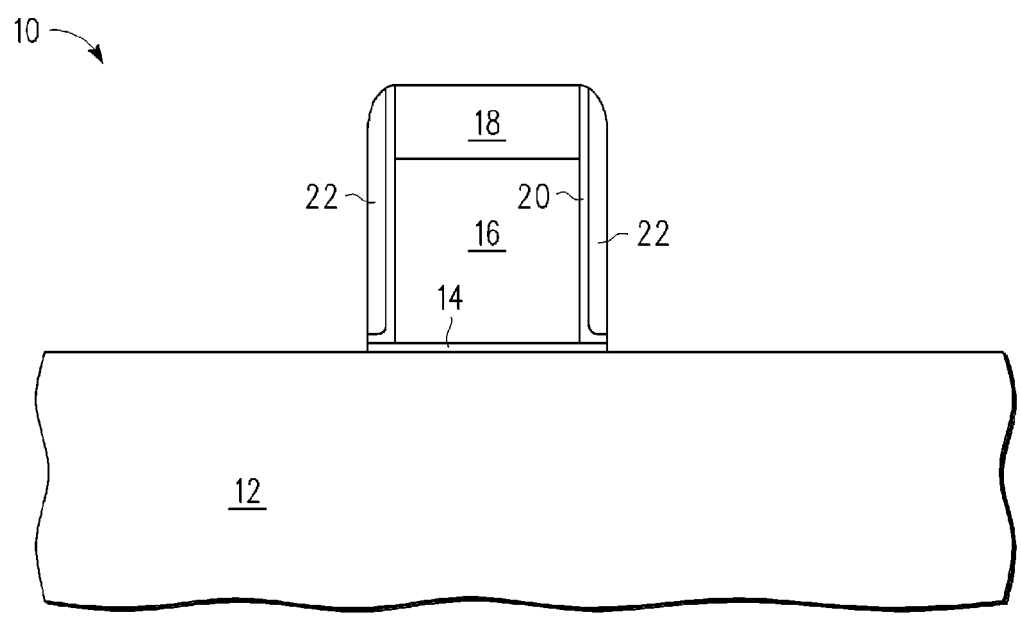

FIG. 4 illustrates semiconductor structure 10 after removal of exposed portions of liner layer 20 over ARC 18 and over substrate 12 and removal of portions of gate dielectric layer 14 which lie on either side of spacer 22. In one embodiment, a wet etch is performed to remove these portions of liner layer 20 and gate dielectric layer 14.

Figure 5:
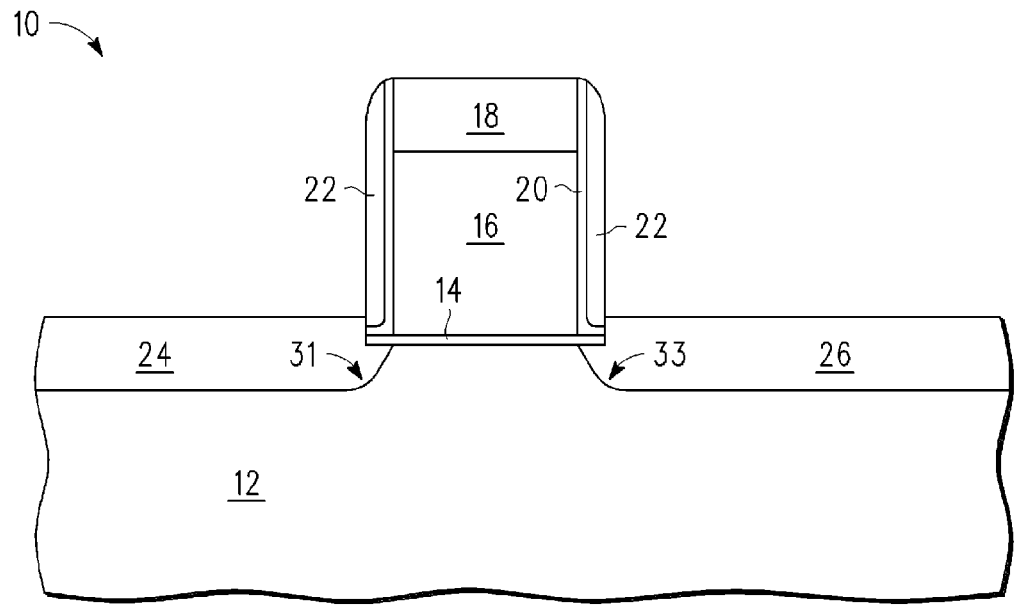

FIG. 5 illustrates semiconductor structure 10 after growing an oxide 24 and 26 over exposed portions of substrate 12, on either side of spacer 22. Note that the oxide grows over substrate 12 as well as consumes portions of substrate 12. In consuming portions of substrate 12, oxides 24 and 26 may also form under gate dielectric 14. Also, note that oxides 24 and 26 have rounded corners 31 and 33.

Figure 6:
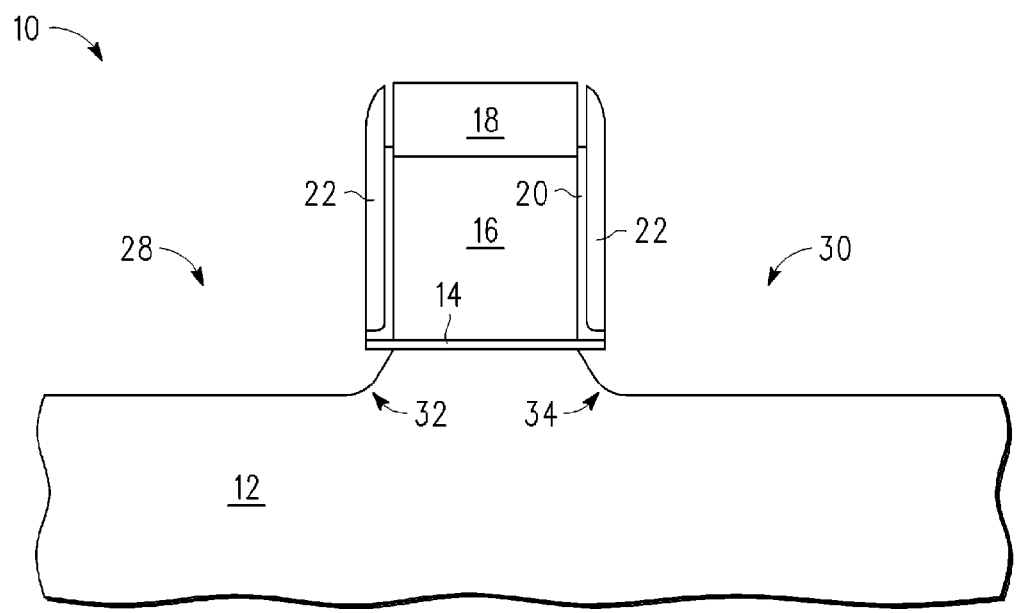

FIG. 6 illustrates semiconductor structure 10 after removal of oxides 24 and 26. In one embodiment, a wet etch may be used to remove oxides 24 and 26. Alternatively, other methods, such as a dry etch, may be used. Removal of oxides 24 and 26 results in recessed regions 28 and 30 of substrate 12, where regions 28 and 30 are recessed with respect to the interface between gate dielectric layer 14 and substrate 12. Due to the rounded corners 31 and 33 of oxides 24 and 26, recessed regions 28 and 30 also have rounded corners 32 and 34. Also, note that recessed regions 24 and 26 are adjacent sidewalls of select gate 16 and may also extend under gate dielectric layer 14. During the removal of oxides 24 and 26, liner layer 22 may also be recessed. Note that in the illustrated embodiment, select gate 16 may operate as a mask during for the formation of recessed regions 28 and 30. In an alternate embodiment, note that the growing and subsequent removal of other materials may be used to form recessed regions 28 and 30. Alternatively, other methods may be used to form recessed regions 28 and 30.

Figure 7:
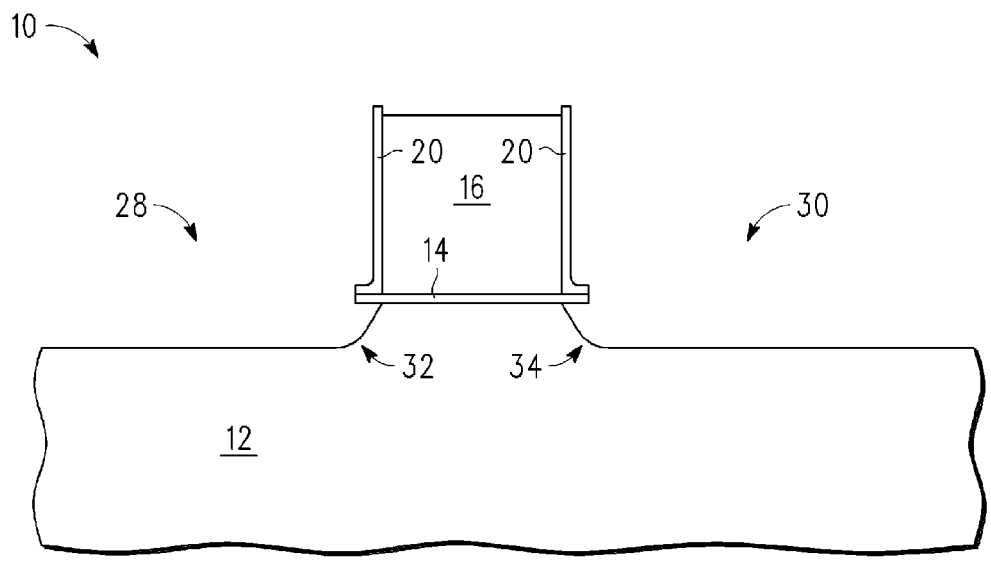

FIG. 7 illustrates semiconductor structure 10 after removal of spacer 22 and ARC 18. In one embodiment, a nitride wet etch may be used to remove spacer 22 and ARC 18. In an alternate embodiment, note that spacer 22 or a portion of spacer 22 may be left within semiconductor structure 10.

Figure 8:
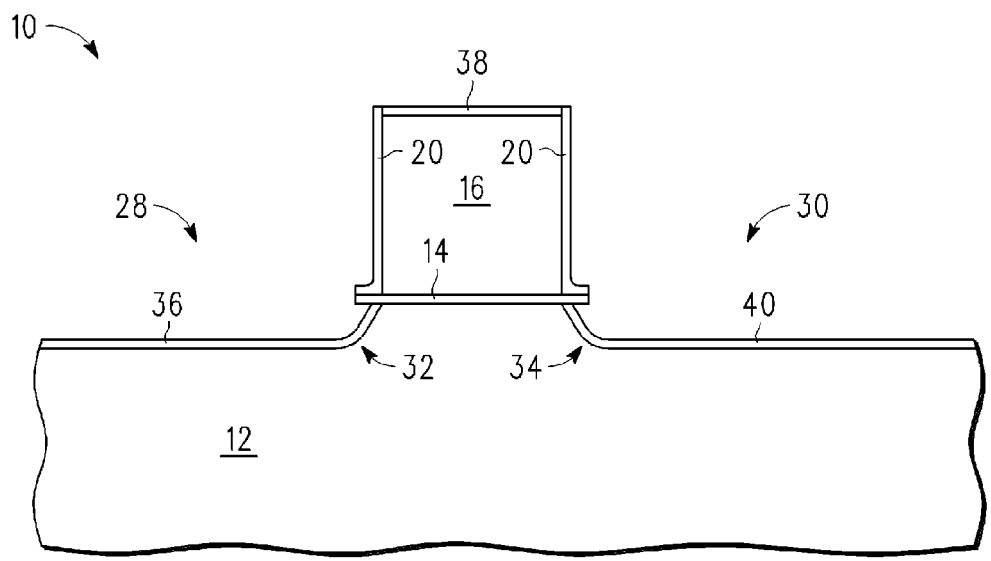

FIG. 8 illustrates semiconductor structure 10 after growing oxides on exposed portions of substrate 12 and select gate 16 to form tunnel oxides 36 and 40 on substrate 12 on either side of spacer 22 and to form an oxide 38 on select gate 16. Note that during the oxide growth, exposed portions of liner layer 20 and gate dielectric 14 may also increase in size. In one embodiment, oxides 36 and 40 are grown to a thickness in a range of approximately 4 to 10 nanometers.

Figure 9:
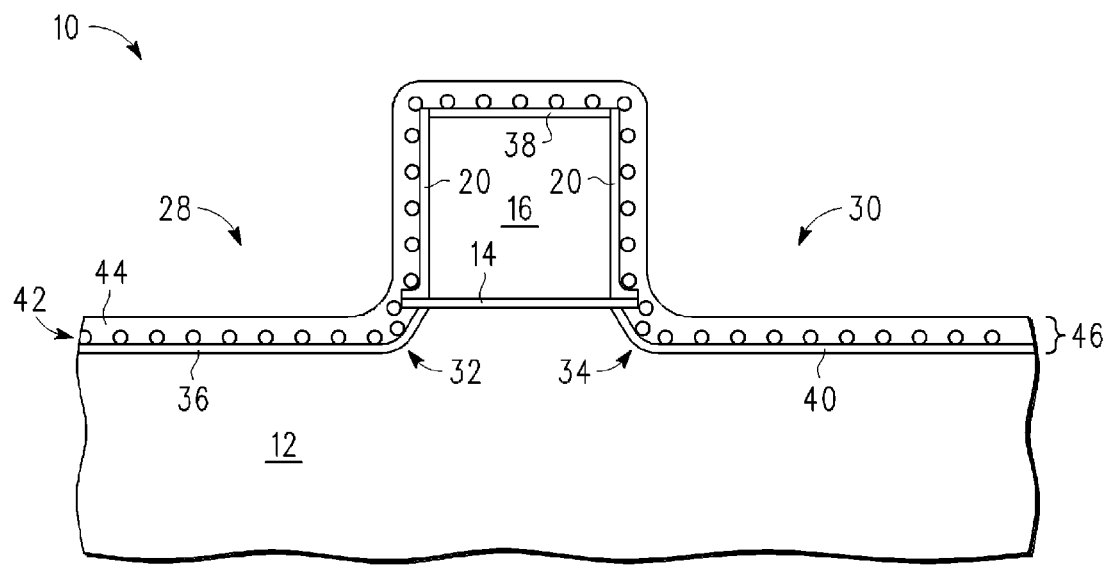

FIG. 9 illustrates semiconductor structure 10 after formation of nanocrystals 42 and insulating layer 44 over and surrounding nanocrystals 42. In one embodiment, nanocrystals 42 have diameters in a range of approximately 3 to 20 nanometers. Conventional processing may be used to form nanocrystals 42. Nanocrystals 42 may include any type of conductive material, such as, for example, silicon, germanium, a metal, or the like. Insulating layer 44 is formed over and surrounding nanocrystals 42, and, in one embodiment, is an oxide layer. Alternatively, insulating layer 44 may include hafnium oxide, aluminum oxide, etc. In one embodiment, insulating layer 44 has a thickness in a range of 8 to 20 nanometers. Therefore, note that oxides 36 and 40 (over substrate 12), oxide 38 (over select gate 16), liner 20 (along the sidewalls of select gate 16 and over portions of gate dielectric 14 which extend out from select gate 16) in addition to overlying nanocrystals 42 and insulating layer 44 form a charge storage layer 46. In one embodiment, charge storage layer 46 has a total thickness in a range of approximately 12 to 30 nanometers. Therefore, in one embodiment, charge storage layer 46 may be referred to as a thin storage layer which has a thickness of at most approximately 30 nanometers. Note that a portion of charge storage layer 46 is formed in recessed regions 28 and 30 and another portion of charge storage layer 46 is formed along a first sidewall of select gate 16. In alternate embodiments, any type of charge storage layer may be used. For example, charge storage layer 46 may include a single nitride layer, a trap oxide layer, or may include a stack of different layers.

Figure 10:
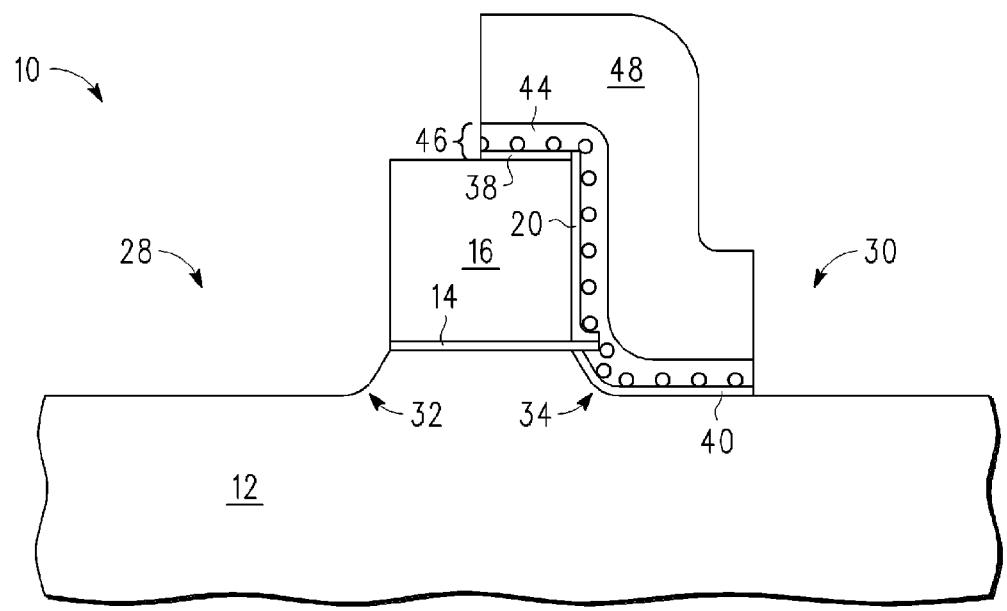

FIG. 10 illustrates semiconductor structure 10 after formation of a control gate 48 over a portion of select gate 16 and over substrate 12 within recessed region 30. That is, note that control gate 48 is formed such that it overlies a portion of select gate 16 and extends over a sidewall of select gate 16 onto substrate 12 within recessed region 30. In one embodiment, control gate 48 is formed using conventional deposition and etching techniques. Note that during the etch to form control gate 48, portions of charge storage layer 46 are also etched, such that charge storage layer 46 remains between control gate 48 and select gate 16 and between control gate 48 and substrate 12 in recessed region 30. In one embodiment, control gate 48 may include polysilicon, a metal, titanium nitride, etc., or combinations thereof.

Figure 11:
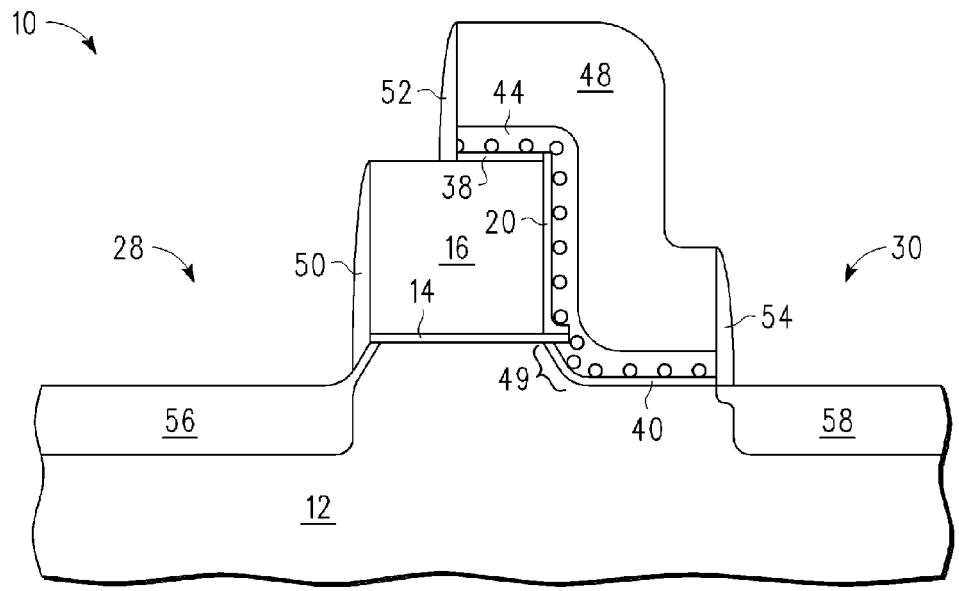

FIG. 11 illustrates semiconductor structure 10 after formation of spacers 50, 52, and 54 and formation source/drain regions 56 and 58 in substrate 12 to form a substantially completed split gate device. Spacer 50 is formed along a sidewall of select gate 16, and spacers 52 and 54 are formed along sidewalls of charge storage layer 46 and control gate 48, respectively. Conventional processing and materials may be used to form spacers 50, 52, and 54. Conventional processing may be used to form source/drain regions 56 and 58. In one embodiment, source/drain region 56 includes an extension region which extends under gate dielectric layer 14 and source/drain region 58 includes an extension region which extends under charge storage layer 46. In one embodiment, source/drain region 58 may be referred to as a source region which is adjacent a first sidewall of select gate 16 where a portion of control gate 48 is between the first sidewall of select gate 16 and the source region, and source/drain region may be referred to as a drain region which is adjacent a second sidewall of select gate 16. (Note that, in an alternate embodiment, a portion of spacer 22 may remain between liner 20 and nanocrystals 42.)

Therefore, a substantially completed nanocrystal split gate device (also referred to as a split gate bitcell) is illustrated in FIG. 11. Note that rounded corners 32 and 34 allow for a thicker oxide in these corners underlying nanocrystals 42. That is, note that tunnel oxide 40 is thicker in these corner regions. This may allow for an increased breakdown voltage and thus helps improve program and erase operation. Also, the thicker oxide may also for different polarities of an erase operation of the device and may also reduce any gap nanocrystal effect. The recessed regions in which charge storage layer 46 is formed may also allow for improved program operation due to improved ballistic injection. This improvement in ballistic injection may result from a slant 49 in charge storage layer 46 at the interface between charge storage layer 46 and substrate 12. Also, slant 49 may result in increased current drive, thus possibly resulting in improved read operations of the split gate bitcell. Also, slant 49 may allow for further scaling due to a more compact gate length as compared to a flat layer (with the slant).

Figure 12:
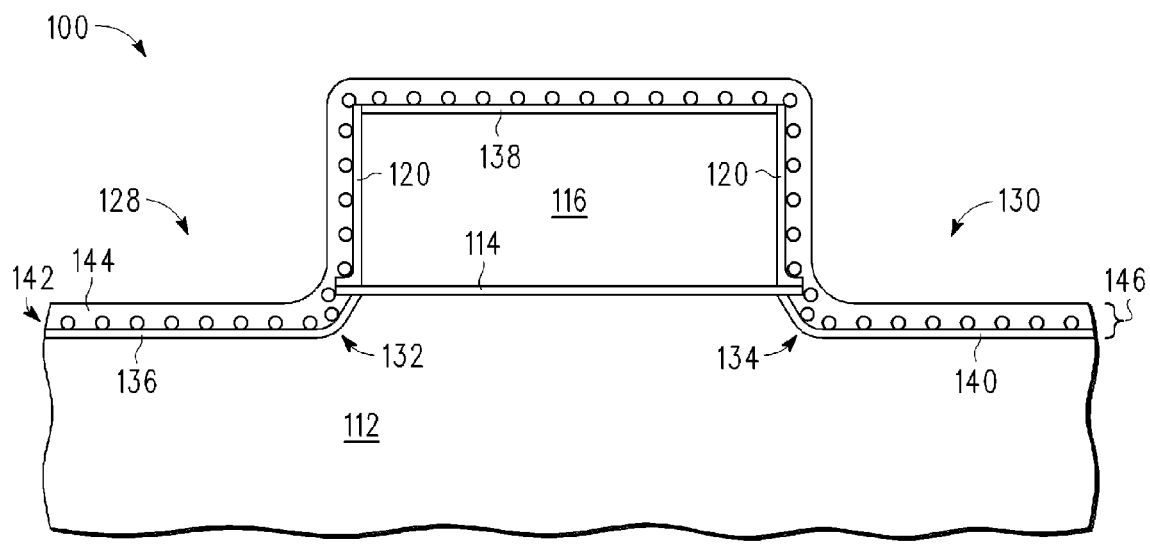
FIGS. 12-15 illustrate a method for forming two split gate transistors in accordance with one embodiment of the present invention.

FIG. 12 illustrates a semiconductor structure 100 according to an alternate embodiment. Note that processing up to FIG. 12 is equivalent to the processing as described in FIGS. 1-9, with the exception that select gate 116 is longer in length as compared to select gate 16, to accommodate formation of two split-gate devices, as will be seen with respect to FIGS. 13-15. Therefore, note that the descriptions provided above for items 12, 36, 42, 44, 46, 20, 16, 14, 38, 40, 28, and 30 also apply to items 112, 136, 142, 144, 146, 120, 116, 114, 138, 140, 128, and 130, respectively, and thus will not be repeated herein. FIG. 12 therefore illustrates semiconductor structure 10 having a substrate 112, recessed regions 128 and 130 adjacent sidewalls of select gate 116, gate dielectric layer 114, select gate 116, liner 120, oxides 136, 138, and 140, nanocrystals 142, and insulating layer 144. Note that charge storage layer 146 may therefore include oxides 136, 138, and 140, liner 120, nanocrystals 142, and insulating layer 144.

Figure 13:
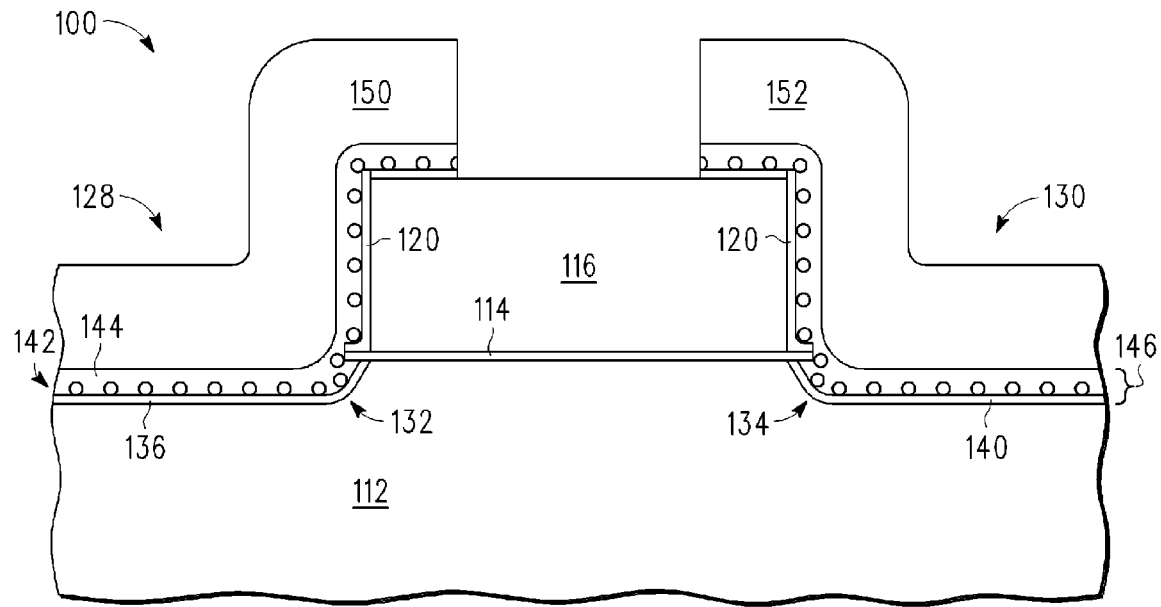

FIG. 13 illustrates semiconductor structure 100 after formation of a control gate electrode layer over charge storage layer 146, and patterning and etching portions of the control gate electrode layer over select gate 116 to form separate control gate portions 150 and 152. Also, note that portions of charge storage layer 146 between control gate portions 150 and 152, over select gate 116, are also removed. Conventional deposition, patterning, and etching may be used to form control gate portions 150 and 152.

Figure 14:
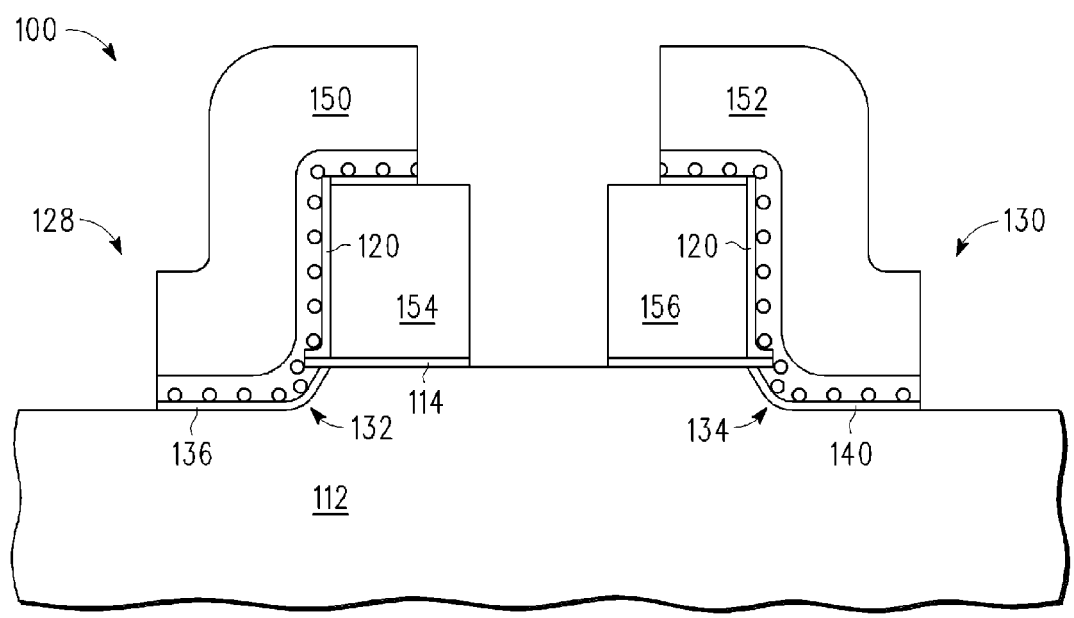

FIG. 14 illustrates semiconductor structure 100 after formation of two separate select gates 154 and 156. Conventional patterning and etching may be performed to etch portions of control gate portions 150 and 152 and portions of charge storage layer 146 overlying substrate 112 within recessed regions 128 and 130, as well as to etch portions of select gate 116 to form an opening within select gate 116, exposing gate dielectric layer 114 and resulting in two separate select gates 154 and 156. Also, conventional patterning and etching may be used to remove portions of gate dielectric layer 114 between select gates 154 and 156, exposing substrate 112. Note that each select gate 154 and 156 has a corresponding control gate 150 and 152, respectively, where control gate 150 is formed along a sidewall of select gate 154 and over substrate 112 in recessed region 128, and control gate 152 is formed along a sidewall of select gate 156 and over substrate 112 in recessed region 130. As seen in the illustrated embodiment, recessed region 128 is adjacent a sidewall of select gate 154 and recessed region 130 is adjacent a sidewall of select gate 156. Also, note that a first portion of charge storage layer 146 is formed within recessed region 130, a second portion of charge storage layer 146 is formed along a sidewall of select gate 156, a third portion of charge storage 146 is formed within recessed region 128, and a fourth portion of charge storage layer 146 is formed within recessed region 128.

Figure 15:
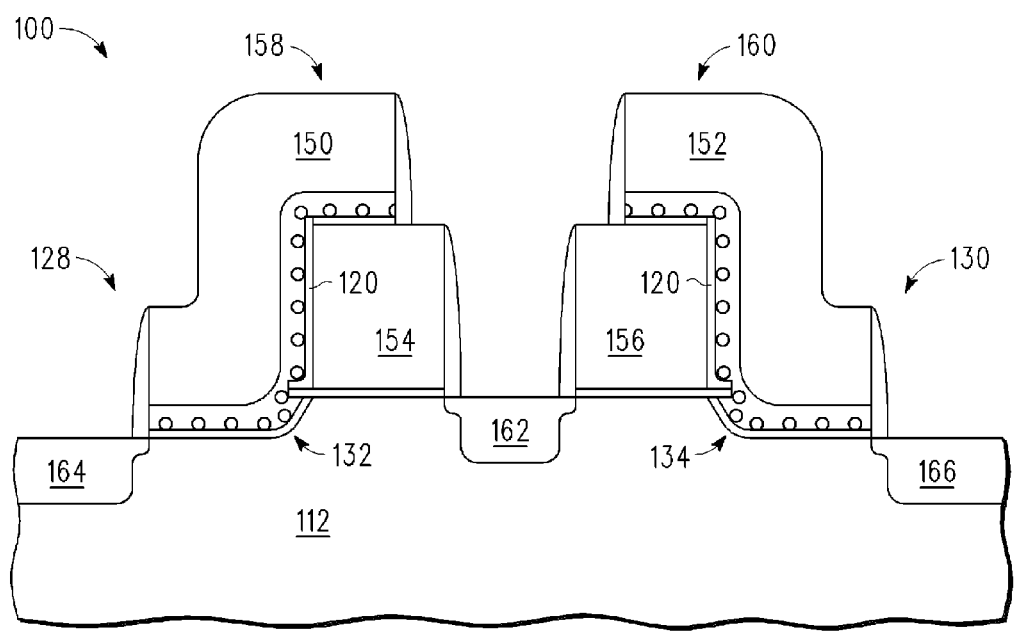

FIG. 15 illustrates semiconductor structure 100 after formation of sidewall spacers, source/drain regions 164 and 166, and shared source/drain region 162, to form two substantially completed split gate devices 158 and 160 which share a source/drain region. Therefore, note that select gate 154, control gate 150, and the portions of charge storage layer 146 between control gate 150 and substrate 112 and between control gate 150 and select gate 154 form a first split gate device 158 (which may also be referred to as a split gate transistor or bitcell), and select gate 156, control gate 152, and the portions of charge storage layer 146 between control gate 152 and substrate 112 and between control gate 152 and select gate 156 form a second split gate device 160 (which may also be referred to as a split gate transistor or bitcell). In one embodiment, shared source/drain region 162 may be a shared drain region, source/drain region 164 may be a source region where a portion of control gate 150 lies between the source region and a sidewall of select gate 154, and source/drain region 166 may be a source region where a portion of control gate 152 lies between the source region and a sidewall of select gate 156. Note also, that in an alternate embodiment, a portion of a spacer (similar to spacer 22) may remain between liner 120 and nanocrystals 142 in each of devices 158 and 160.

Note that split gate devices 158 and 160 also include thicker oxide portions at corners 132 and 134, and includes slants of recessed regions 128 and 130, which may allow for the same improvements as discussed above with respect to FIG. 11.

By now it should be appreciated that there has been provided a method for forming a nanocrystal split gate device useful as a bitcell in a memory. Through the use of recessed regions which may allow for rounded corners, a slant portion between the substrate and control gate, and for a thicker oxide beneath the nanocrystals, an improved split gate device may be achieved.

In one embodiment, a method of making a semiconductor device on a semiconductor layer includes forming a first select gate having a first sidewall over the semiconductor layer, forming a first recess in the semiconductor layer adjacent to the first sidewall of the first select gate, forming a thin layer of charge storage material, wherein a first portion of the thin layer of charge storage material is formed in the first recess and a second portion of the thin layer of charge storage material is formed along the first sidewall of the first select gate, and forming a first control gate over the first portion of the thin layer of charge storage material.

In a further embodiment, the step of forming the first recess includes growing a material on the semiconductor layer, and removing the material to result in the first recess. In yet a further embodiment, the step of growing the material is further characterized by the material being oxide. In yet an even further embodiment, the step of forming the thin layer of charge storage material comprises forming a layer of one of a group consisting of nanocrystals and nitride.

In another further embodiment, the method further includes forming a sidewall spacer adjacent to the first sidewall of the first select gate prior to the step of forming the first recess, and removing sidewall spacer after the step of forming the first recess and before the step of forming the thin layer of charge storage material.

In another further embodiment, the method further includes forming a gate dielectric prior to forming the select gate, where the gate dielectric is on the semiconductor layer and the select gate is on the gate dielectric.

In another further embodiment, the method further includes forming a drain region in the semiconductor layer adjacent to a second sidewall of the select gate. In yet a further embodiment, the method further includes forming a source in the semiconductor layer, where the first control gate is between the first sidewall of the first select gate and the source.

In another further embodiment, the method further includes forming a second select gate having a first sidewall, forming a second recess adjacent the first sidewall of the second select gate, and forming a second control gate over the second recess, where the step of forming a thin layer of charge storage material is further characterized by a third portion of the thin layer of charge storage material being formed in the second recess and a fourth portion of the thin layer of charge storage material being formed along the first sidewall of the second select gate. In yet an even further embodiment, the method further includes forming a drain in the semiconductor layer between the first and second select gates. In yet another even further embodiment, the steps of forming the first and second select gates includes forming a layer of gate material over the semiconductor layer, etching the gate material to leave a portion of gate material having a first sidewall and a second sidewall, wherein the step of forming the first recess and the step of forming the second recess are further characterized by the first recess being adjacent to the first sidewall of the portion of gate material and the second recess being adjacent to the second sidewall of the portion of gate material, and etching through the portion of gate material to leave the first select gate and the second select gate.

In another embodiment, a method of forming a semiconductor device on a semiconductor layer includes forming a first select gate over the semiconductor layer, recessing the semiconductor layer in a first region using the first select gate as a mask, forming a charge storage layer in the first region having a thickness less than 300 Angstroms (30 nanometers), forming a first control gate over the first region after forming the charge storage layer, forming a drain adjacent to the first select gate in the semiconductor layer, and forming a first source adjacent to the first control gate in the semiconductor layer.

In a further embodiment of the another embodiment, the step of recessing includes growing oxide in the first region, and removing the oxide. In yet a further embodiment, the step of forming the charge storage layer comprises forming a one of group consisting of nanocrystals and nitride.

In another further embodiment of the another embodiment, the method further includes forming a sidewall spacer adjacent to the first sidewall of the first select gate prior to the step of forming the first recess, where the step of forming the charge storage layer is further characterized as forming the charge storage layer over the sidewall spacer.

In another further embodiment of the another embodiment, the step of forming the storage layer is further characterized by forming the storage layer in a second region in the semiconductor layer, and the method further includes forming a second select gate over the semiconductor layer, recessing the semiconductor layer in the second region prior to the step of forming the storage layer, forming a second control gate over the second region, and forming a second source adjacent to the second control gate, where the step of forming the drain is further characterized as forming the drain adjacent to the second select gate. In yet a further embodiment, the steps of forming the first and second select gates includes forming a gate material over the semiconductor layer, etching the gate material prior to the steps of recessing to form an gate portion, and etching through the gate portion to leave the first and second select gates.

In yet another embodiment, a semiconductor device includes a semiconductor layer having a first recess, a first select gate over the semiconductor layer adjacent to the first recess, a thin layer of charge storage material in the first recess, a first control gate over the first recess, a first drain adjacent to the select gate, and a first source in the first recess and adjacent to the first control gate.

In a further embodiment of the yet another embodiment, the thin layer of charge storage material comprises nanocrystals, and the thin layer of charge storage material is further characterized as being between the first select gate and the first control gate.

In yet another further embodiment of the yet another embodiment, the semiconductor layer is further characterized by having a second recess, and the semiconductor device further includes a second select gate over the semiconductor layer adjacent to the second recess, where the thin layer of charge storage material is further characterized as being in the second recess, a second control gate over the second recess, and a second source in the second recess and adjacent to the second control gate, where the first drain is adjacent to the second select gate.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different thin charge storage layers may be used, spacers (such as spacer 22) may be left within the final device, or two devices which share a source/drain region may be formed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device on a semiconductor layer, comprising:
    forming a first select gate having a first sidewall over the semiconductor layer;
    forming a first recess in the semiconductor layer adjacent to the first sidewall of the first select gate;
    forming a thin layer of charge storage material, wherein a first portion of the thin layer of charge storage material is formed in the first recess and in direct contact with the semiconductor layer, and a second portion of the thin layer of charge storage material is formed along the first sidewall of the first select gate;
    forming a first control gate over the first portion of the thin layer of charge storage material;
    forming a first source/drain region in the semiconductor layer adjacent to a second sidewall of the first select gate, and forming a second source/drain region in the semiconductor layer, wherein the first control gate is between the first sidewall of the first select gate and the second source/drain region, and wherein the second source/drain region is formed below the first recess and not within the first recess;
    forming a sidewall spacer adjacent to the first sidewall of the first select gate prior to the step of forming the first recess; and
    removing at least a portion of the sidewall spacer after the step of forming the first recess and before the step of forming the thin layer of charge storage material.

2. The method of claim 1, wherein the step of forming the first recess comprises:
    growing a material on the semiconductor layer; and
    removing the material to result in the first recess.

3. The method of claim 2, wherein the step of growing the material is further characterized by the material being oxide.

4. The method of claim 3, wherein the step of forming the thin layer of charge storage material comprises forming a layer of one of a group consisting of nanocrystals and nitride.

5. The method of claim 1, further comprising forming a gate dielectric prior to forming the select gate, wherein the gate dielectric is on the semiconductor layer and the select gate is on the gate dielectric.

6. A method of making a semiconductor device on a semiconductor layer, comprising:
    forming a first select gate having a first sidewall over the semiconductor layer;
    forming a first recess in the semiconductor layer adjacent to the first sidewall of the first select gate;
    forming a thin layer of charge storage material, wherein a first portion of the thin layer of charge storage material is formed in the first recess and in direct contact with the semiconductor layer, and a second portion of the thin layer of charge storage material is formed along the first sidewall of the first select gate;
    forming a first control gate over the first portion of the thin layer of charge storage material;
    forming a first source/drain region in the semiconductor layer adjacent to a second sidewall of the first select gate, and forming a second source/drain region in the semiconductor layer, wherein the first control gate is between the first sidewall of the first select gate and the second source/drain region, and wherein the second source/drain region is formed below the first recess and not within the first recess;
    forming a second select gate having a first sidewall;
    forming a second recess adjacent the first sidewall of the second select gate; and
    forming a second control gate over the second recess;
    wherein the step of forming a thin layer of charge storage material is further characterized by a third portion of the thin layer of charge storage material being formed in the second recess and a fourth portion of the thin layer of charge storage material being formed along the first sidewall of the second select gate;
    forming a drain in the semiconductor layer between the first and second select gates;
    wherein the steps of forming the first and second select gates comprise:
        forming a layer of gate material over the semiconductor layer;
        etching the gate material to leave a portion of gate material having a first sidewall and a second sidewall, wherein the step of forming the first recess and the step of forming the second recess are further characterized by the first recess being adjacent to the first sidewall of the portion of gate material and the second recess being adjacent to the second sidewall of the portion of gate material; and etching through the portion of gate material to leave the first select gate and the second select gate.

7. A method of forming a semiconductor device on a semiconductor layer, comprising:

forming a first select gate over the semiconductor layer;

recessing the semiconductor layer in a first region to form a recess using the first select gate as a mask;

forming a charge storage layer in the first region having a thickness less than 300 Angstroms, wherein the charge storage layer in the first region is in direct contact with the semiconductor layer;

forming a first control gate over the first region after forming the charge storage layer;

forming a drain adjacent to the first select gate in the semiconductor layer;

forming a first source adjacent to the first control gate in the semiconductor layer, wherein the first source is below the recess and not within the recess;

wherein the step of forming the storage layer is further characterized by forming the storage layer in a second region in the semiconductor layer, further comprising:

forming a second select gate over the semiconductor layer;

recessing the semiconductor layer in the second region prior to the step of forming the storage layer;

forming a second control gate over the second region; and forming a second source adjacent to the second control gate;

wherein the step of forming the drain is further characterized as forming the drain adjacent to the second select gate; and wherein the steps of forming the first and second select gates comprises:

forming a gate material over the semiconductor layer;

etching the gate material prior to the steps of recessing to form a gate portion; and etching through the gate portion to leave the first and second select gates.

8. The method of claim 7, wherein the step of recessing comprises:

growing oxide in the first region; and removing the oxide.

9. The method of claim 8, wherein the step of forming the charge storage layer comprises forming a one of group consisting of nanocrystals and nitride.

10. The method of claim 7, further comprising:

forming a sidewall spacer adjacent to the first sidewall of the first select gate prior to the step of forming the first recess, wherein the step of forming the charge storage layer is further characterized as forming the charge storage layer over the sidewall spacer.

11. The method of claim 1, wherein in the recess, the charge storage layer comprises a slant portion at an interface between the charge storage layer and the semiconductor layer.

12. The method of claim 7, wherein in the recess, the charge storage layer comprises a slant portion at an interface between the charge storage layer and the semiconductor layer.

* * * * *